United States Patent
Norte et al.

(10) Patent No.: US 6,380,482 B1
(45) Date of Patent: Apr. 30, 2002

(54) ELECTROMAGNETIC COMPATIBILITY SLEEVE FOR ELECTRICAL INTERCONNECTIONS

(75) Inventors: David A. Norte; Woong K. Yoon, both of Westminister, CO (US)

(73) Assignee: Avaya Technology Corp., Basking Ridge, NJ (US)

( * ) Notice: Subject to any disclaimer, the term of this patent is extended or adjusted under 35 U.S.C. 154(b) by 0 days.

(21) Appl. No.: 09/651,707

(22) Filed: Aug. 31, 2000

(51) Int. Cl.[7] ................................................. H05K 9/00
(52) U.S. Cl. .............................. 174/35 R; 174/35 MS; 361/816; 361/818
(58) Field of Search ......................... 174/35 R, 35 MS; 361/748, 752, 753, 756, 757, 759, 816, 818; 439/607, 608, 939; 455/300, 301

(56) References Cited

U.S. PATENT DOCUMENTS

| | | | | |
|---|---|---|---|---|
| 3,350,497 A | * | 10/1967 | Weaver, Jr. et al. | .......... 174/35 |
| 3,562,402 A | * | 2/1971 | Dwyer | .......... 174/35 |
| 4,115,656 A | * | 9/1978 | Aitel | .......... 174/35 MS |
| 6,201,704 B1 | * | 3/2001 | Poplawski et al. | .......... 361/753 |

* cited by examiner

Primary Examiner—Anthony Dinkins
Assistant Examiner—Carmelo Oliva
(74) Attorney, Agent, or Firm—John C. Moran

(57) ABSTRACT

Using an adjustable sleeve that provides electromagnetic interference (EMI) shielding, is lightweight, and is adjustable in its length. The electromagnetic compatibility sleeve is formed by attaching electromagnetic foil shields on one or both sides of an insulating material that is accordion-in-structure in a first embodiment so that its length is flexible. The insulating material can be a very high resistivity and magnetically lossy ferrite material to prevent eddy currents on the inner surface from causing magnetic fields within the insulating material In a second embodiment, the sleeve is made up of telescoping sections so that the length is flexible. This flexible sleeve is attached to systems by the utilization of a mounting bracket, one for each system. The electromagnetic sleeve confines the radiation from a printed circuit extender to within the sleeve and prevents radiation from exiting the systems through enclosure openings by the utilization of the mounting brackets.

3 Claims, 3 Drawing Sheets

TOP VIEW

FRONT VIEW

SIDE VIEW

ELECTROMAGNETIC COMPATIBILITY SLEEVE FOR ELECTRICAL INTERCONNECTIONS

TECHNICAL FIELD

This invention relates to interconnection of electronic systems and, in particular, to the shielding of such interconnections.

BACKGROUND OF THE INVENTION

In the prior art, communications switching systems such as circuit switching systems and data switching systems have a problem with the installation and subsequent need to increase capacity of small systems. For example, telecommunication switching system (circuit-switching) manufacturers face an economic hurdle to install a system that can handle twenty telephones but can grow to one hundred telephones. The initial system that is installed to handle twenty telephones is extremely cost-sensitive to the addition of such things as external connectors for the later attachment of cables for an additional system cabinet that will provide more telephones at a later point in time. The prior art has resolved this problem as illustrated in FIGS. 1–3. The initial system that is installed is switching system 101 which can handle a maximum number of telephones. Switching system 101 is mounted in a rack or a cabinet. When the capacity of switching system 101 has been exceeded, the architecture of switching system 101 allows printed circuit extender 103 to be plugged into the back plane of switching system 101 so as to extend the back plane. Printed circuit extender 103 then plugs into switching system 102 that will add the additional capacity to handle more telephones. Printed circuit extender 103 plugs directly into the back plane via a slot that would normally be utilized for a printed circuit board. Hence, switching system 101 does not have to have an external connector permanently wired to the printed circuit board that allows a cable to transfer the signals from the back plane to switching system 102. In addition, it is difficult to maintain the proper electrical characteristics when going from a back plane to a cable composed of wires without utilizing additional drivers that add greatly to the initial cost of the system. At present within the prior art, printed circuit extender 103 is simply positioned through opening 301 of FIG. 3 in switching system 101 and a similar opening in switching system 102. Since printed circuit extender 103 is a printed circuit board which is not adequately shielded against the radiation of electromagnetic interference (EMI), the portion of printed circuit extender 103 that is exposed as illustrated by distance 104 in FIG. 1 can radiate electromagnetic energy causing interference. In addition, EMI can also radiate from opening 301 from switching system 101 and similarly from switching system 102. Adding to this problem is the fact that distance 104 can vary due to mounting considerations in the field. Note, that whereas switching systems 101 and 102 are illustrated as being mounted side by side which is often the case for telecommunication systems, switching system 102 can be mounted on a rack directly below switching system 101 in a rack which is often the case for packet switching systems. Printed circuit extender 103 then would extend in the vertical direction.

To resolve these problems what is needed is a method of shielding printed circuit extender 103 utilizing an apparatus that is light and whose length is adjustable.

SUMMARY OF THE INVENTION

The foregoing problems are solved and a technical advance is achieved by an adjustable sleeve that provides electromagnetic interference (EMI) shielding, is lightweight, and is adjustable in its length. The electromagnetic compatibility sleeve is formed by attaching electromagnetic foil shields on one or both sides of an insulating material that is accordion-in-structure in a first embodiment so that its length is flexible. Advantageously, the insulating material can be a very high resistivity and magnetically lossy ferrite material to prevent eddy currents on the inner surface from causing magnetic fields within the insulating material. In a second embodiment, the sleeve is made up of telescoping sections so that the length is flexible. This flexible sleeve is attached to systems by the utilization of a mounting bracket, one for each system. Advantageously, the electromagnetic sleeve confines the radiation from a printed circuit extender to within the sleeve and prevents radiation from exiting the systems through enclosure openings by the utilization of the mounting brackets.

These and other features and advantages of the invention will become apparent from the following description of the illustrated embodiments of the invention considered together with the drawing.

DETAILED DESCRIPTION

Figure 3:
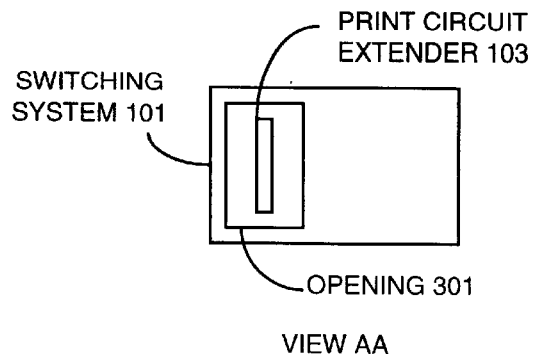
Figure 4:
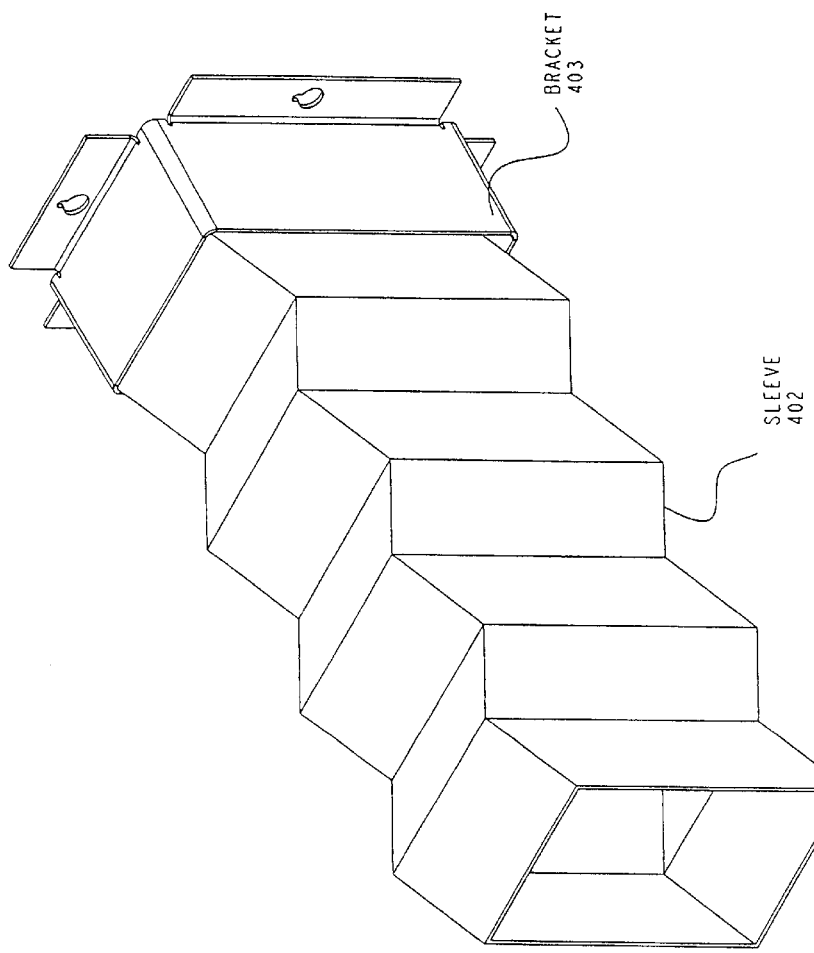
FIG. 4 is a perspective view of a sleeve in accordance with a first embodiment of the invention.
Figure 4:
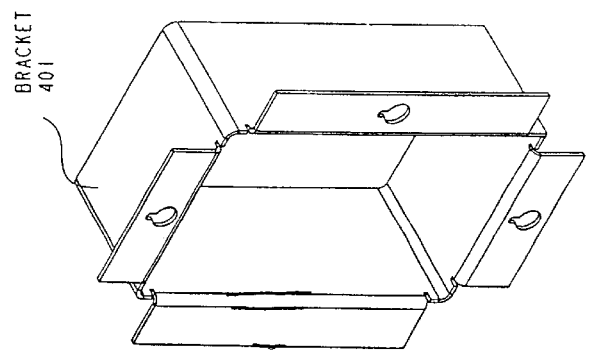

FIG. 4 illustrates a first embodiment of the invention as a perspective view of electromagnetic sleeve 402 with brackets 401 and 403. Bracket 401 fits around opening 301 of FIG. 3 of switching system 101. Brackets 401 and 403 are illustrated as separate units but one skilled in the art could readily envision that brackets 401 and 403 could be an integral part of sleeve 402. When bracket 401 is not present, opening 301 is covered with a blank piece of metal. Similarly, bracket 403 attaches onto switching system 102. Sleeve 402 then is inserted into brackets 401 and 403. This insertion provides good electrical contact so that sleeve 402 is electrically connected to switching system 101 and 102. In turn, switching systems 101 and 102 are electrically interconnected via sleeve 402 with respect to their outer enclosures.

Figure 1:
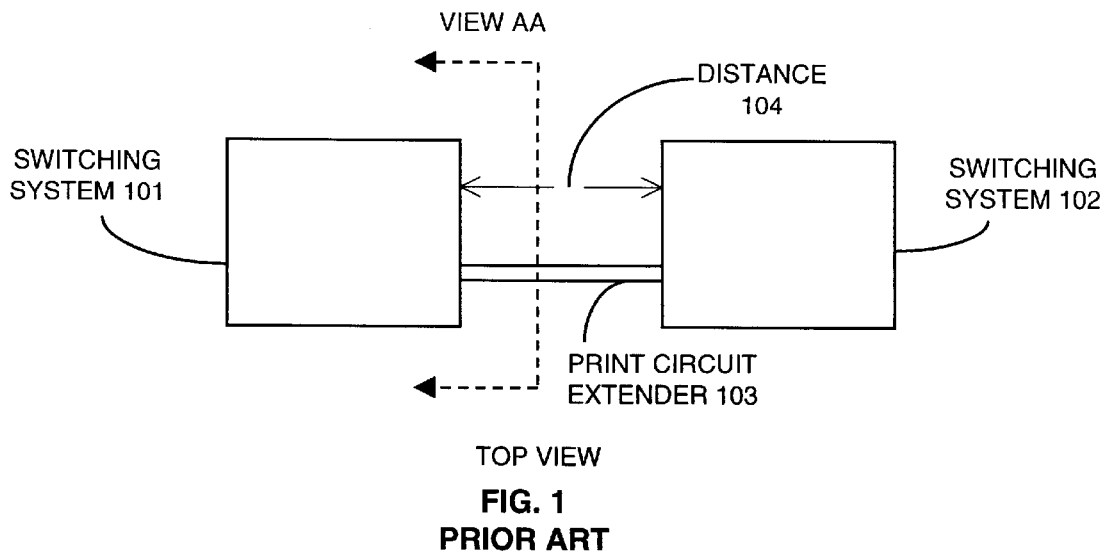
FIGS. 1–3 illustrate the prior art.
Figure 2:
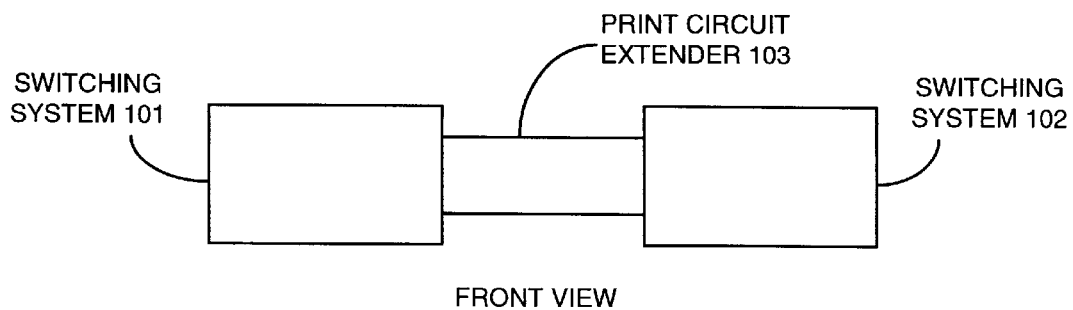
Figure 5:
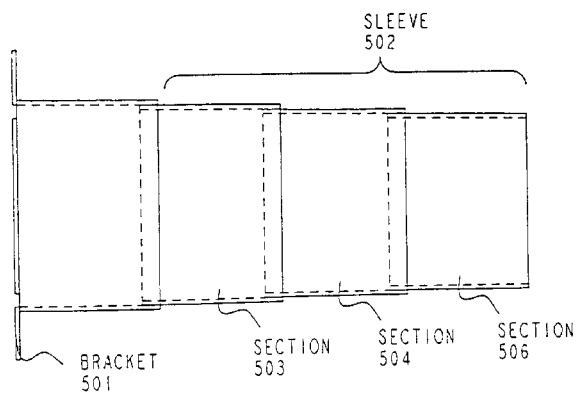
FIG. 5 is a top view of the sleeve in accordance with a second embodiment of the invention.
Figure 6:
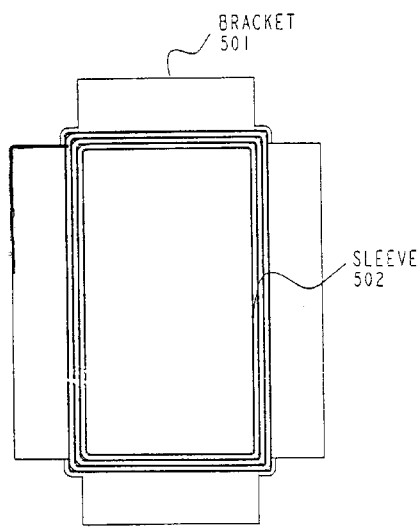
FIG. 6 is a front view of the sleeve in accordance with the second embodiment of the invention.
Figure 7:
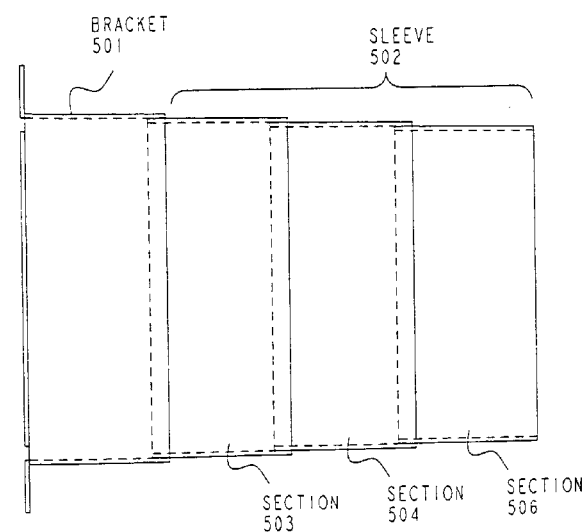
FIG. 7 is a side view of the sleeve in accordance with the second embodiment of the invention.

FIGS. 5–7 illustrate a top view, front view, and side view, respectively, of a second embodiment of the invention. FIGS. 5–7 only illustrate bracket 501 and sleeve 502, but one skilled in the art could readily understand that there would be a second bracket similar in construction to bracket 501. This other bracket would attach to the other end of sleeve 502 so that sleeve 502 could be attached to switching system 102 of FIG. 1 when bracket 501 is attached to switching system 101. Sleeve 502 comprises sections 503–506. Each section is an open-ended cube whose dimensions are such that section 506 slides into section 504, section 504 slides into section 503, and section 503 slides into bracket 501.

Figure 8:
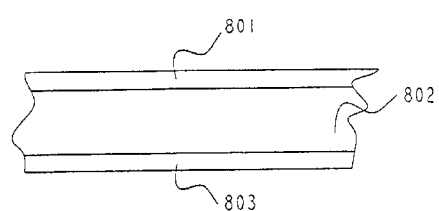
FIG. 8 shows in greater detail a cross-section of the sleeve.

FIG. 8 illustrates a cross-section of a portion of sleeve 402 or a portion of a section of sleeve 502. Layer 802 is an insulating material, and layers 801 and 803 are electrical conducting and electromagnetic shielding layers. Layer 802 can be a very high resistivity and magnetically lossy ferrite material to prevent eddy currents on the inner layer from causing magnetic fields within layer 802. An example of such a material is material 44 from the Fair-Rite Corp. of Wallkill, N.Y. Material 44 has a volume resistivity of $10^7$ ($\Omega$m). One skilled in the art can readily envision that either layer 801 or layer 803 could be removed to provide an insulating outer or inner surface sleeves 402 or 502.

Of course, various changes and modifications to the illustrative embodiment described above will be apparent to those skilled in the art. For example, those skilled in the art could readily envision that sleeves 402 and 502 could have a circular cross-sectional shape. Such changes and modifications can be made without departing from the spirit and scope of the invention and without diminishing its attendant advantages. It is therefore intended that such changes and modifications be covered by the following claims except insofar as limited by the prior art.

What is claimed is:

1. An apparatus for electromagnetic shielding a printed circuit board extender interconnecting first and second system enclosures from emitting electromagnetic radiation, comprising:

a first bracket attached to the first system enclosure surrounding a first opening in the first system enclosure through which the printed circuit board extender extends into the first system enclosure;

a second bracket attached to the second system enclosure surrounding a second opening in the second system enclosure through which the printed circuit board extender extends into the second system enclosure; and a sleeve attached to both the first and second brackets enclosing the printed circuit board extender without contacting the printed circuit board extender and the sleeve having folding and interconnected sections such that a length of the sleeve is adjustable to fit a distance between the first and second system enclosures and rigid in all other axes where the first and second brackets and the sleeve electrically interconnect the first and second system enclosures and the sleeve comprises a ferromagnetic and electrical conductive inner and outer surfaces and a center material that is a high resistivity and magnetically lossy ferrite material to prevent eddy currents on the inner surface from causing magnetic fields within the center material.

2. The apparatus of claim 1 wherein the sleeve has a four sided accordion structure.

3. The apparatus of claim 1 wherein each section of the folded and interconnected sections is an open-ended cube that are dimensioned such that a first one of the plurality of the sections slides into a second one of the plurality of the sections, and the second one of the plurality of sections slides into a third one of the plurality of the sections.

* * * * *